(12) United States Patent
Chang et al.

(10) Patent No.: US 8,528,886 B2
(45) Date of Patent: Sep. 10, 2013

(54) MATERIAL SHEET HANDLING SYSTEM AND PROCESSING METHODS

(75) Inventors: Chester Hann Huei Chang, Painted Post, NY (US); Michael John Moore, Corning, NY (US); Michael Yoshiya Nishimoto, Painted Post, NY (US); Chunhe Zhang, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 556 days.

(21) Appl. No.: 12/364,183

(22) Filed: Feb. 2, 2009

(65) Prior Publication Data
US 2010/0194011 A1   Aug. 5, 2010

(51) Int. Cl.
  *B23Q 3/00*   (2006.01)
  *B25B 1/00*   (2006.01)
  *B25B 11/00*  (2006.01)
  *B65G 25/00*  (2006.01)
  *H01L 21/302* (2006.01)
  *B24B 49/00*  (2012.01)

(52) U.S. Cl.
  USPC .......... 269/20; 269/21; 438/745; 451/8; 451/11; 414/160

(58) Field of Classification Search
  USPC .......... 269/20, 21, 289 R; 414/160, 222.01, 414/217, 806; 83/177, 53
  See application file for complete search history.

(56) References Cited

U.S. PATENT DOCUMENTS

| | | | |
|---|---|---|---|
| 6,099,056 A | 8/2000 | Siniaguine et al. | 294/643 |
| 6,427,991 B1 | 8/2002 | Kao | 269/21 |
| 6,992,014 B2 * | 1/2006 | Grant et al. | 438/745 |
| 7,176,528 B2 | 2/2007 | Coulliard et al. | 257/347 |
| 7,198,548 B1 * | 4/2007 | Chen | 451/11 |
| 7,260,959 B2 | 8/2007 | Chang et al. | 65/253 |
| 7,275,749 B2 * | 10/2007 | Matsuzawa et al. | 269/21 |
| 7,398,735 B1 | 7/2008 | Sunderland | 104/10 |
| 8,235,062 B2 * | 8/2012 | Lauerhaas et al. | 134/95.1 |
| 2004/0065354 A1 | 4/2004 | Ishizaki et al. | 134/30 |
| 2004/0226655 A1 * | 11/2004 | Kajino et al. | 156/345.11 |
| 2006/0194514 A1 * | 8/2006 | Popescu et al. | 451/8 |
| 2008/0213418 A1 * | 9/2008 | Tan et al. | 425/112 |
| 2010/0104402 A1 * | 4/2010 | Nishimoto et al. | 414/160 |

FOREIGN PATENT DOCUMENTS

| | | |
|---|---|---|
| CN | 1577762 A | 9/2005 |
| CN | 1703774 A | 11/2005 |
| EP | 1 873 824 | 1/2008 |
| EP | 1873824 | 1/2008 |
| JP | 11/000785 | 1/1999 |
| JP | 2007/125667 | 5/2007 |
| JP | 2007/185694 | 7/2007 |
| JP | 2007/320124 | 12/2007 |
| JP | 2007320124 | 12/2007 |
| WO | 2007/037118 | 4/2007 |

* cited by examiner

*Primary Examiner* — Lee D Wilson
*Assistant Examiner* — Seahee Yoon
(74) *Attorney, Agent, or Firm* — Ryan T. Hardee

(57) ABSTRACT

Methods and apparatus provide for delivering a controlled supply of gas to at least one aero-mechanical device to impart a gas flow to suspend a material sheet; preventing lateral movement of the material sheet in at least one direction when suspended; and imparting a stream of water, from a side of the material sheet opposite the at least one aero-mechanical device, to cut the material sheet when suspended.

15 Claims, 7 Drawing Sheets

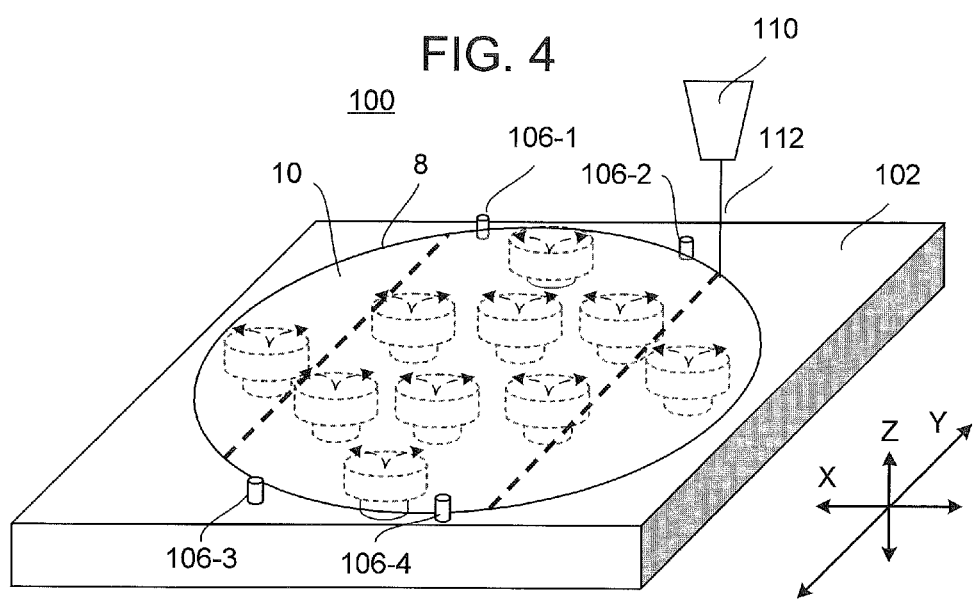
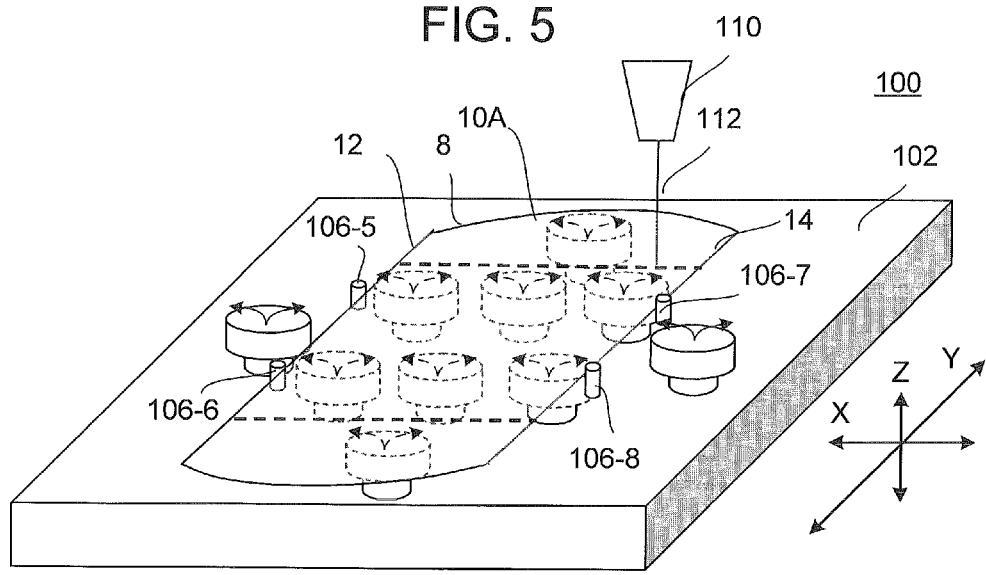

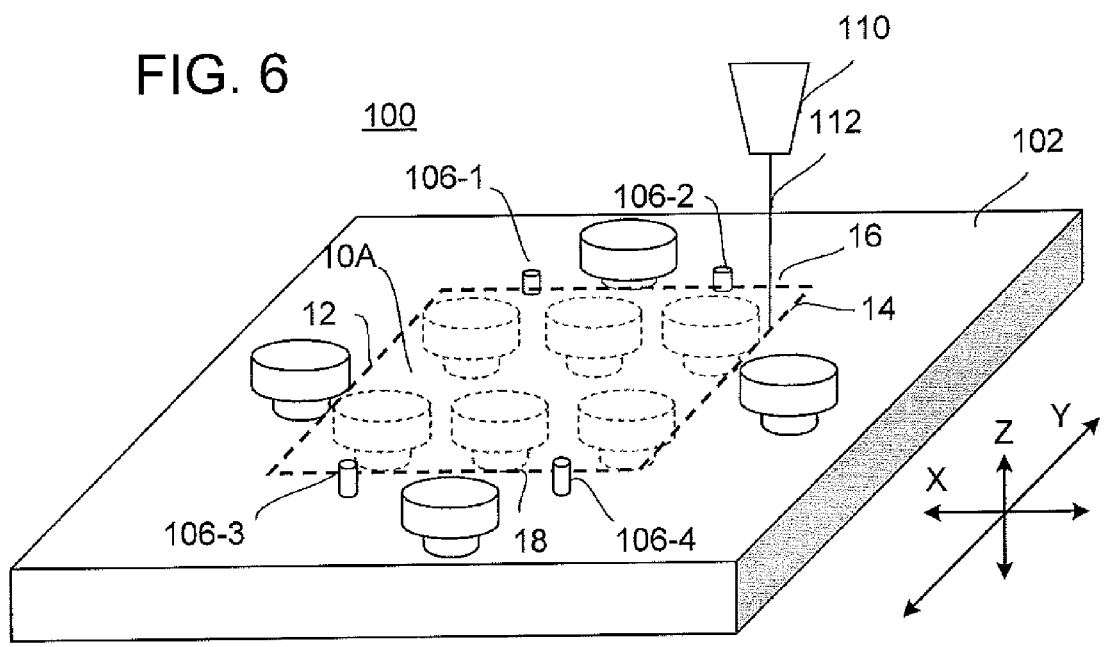
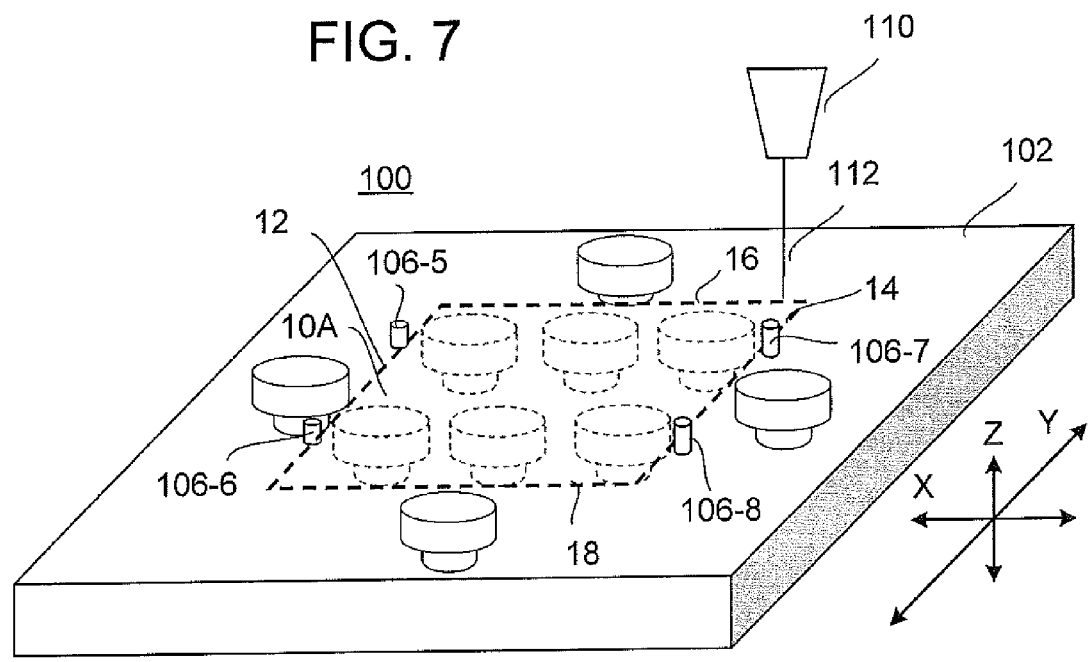

MATERIAL SHEET HANDLING SYSTEM AND PROCESSING METHODS

BACKGROUND

1. Field of the Invention

The present invention relates to the manufacture and handling of material sheets and/or structures, such as semiconductor wafers and tiles, for use in making intermediate structures.

2. Technical Background

Semiconductor on insulator devices are becoming more desirable as market demands continue to increase. SOI technology is becoming increasingly important for high performance thin film transistors (TFTs), solar cells, and displays, such as, active matrix displays, organic light-emitting diode (OLED) displays, liquid crystal displays (LCDs), integrated circuits, photovoltaic devices, etc. SOI structures may include a thin layer of semiconductor material, such as silicon, on an insulating material.

Various ways of obtaining SOI structures include epitaxial growth of silicon (Si) on lattice matched substrates, and bonding a single crystal silicon water to another silicon wafer. Further methods include ion-implantation techniques in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

U.S. Pat. No. 7,176,528 discloses a process that produces an SOG (semiconductor on glass) structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) separating the glass substrate and a thin layer of silicon from the silicon wafer.

The above manufacturing process, as well as many other processes for fabricating, for example SOI structures, may require the availability of high quality semiconductor material sheets (or wafers), such as single crystal silicon wafers. The semiconductor wafers are usually round and, in some applications, must be processed to achieve rectangular wafers or "tiles." Semiconductor tiles are often required to have strict dimensional tolerances, good crystalline orientation alignment and high form accuracy such as straightness, parallelism and perpendicularity. The semiconductor tiles may also need to be rounded on all four corners and chamfered to a specified profile along the four edges of each side in order to survive ion implantation/exfoliation re-use cycles. In addition, the semiconductor tiles must be free of contamination, foreign particles, heat-damage, chipping, micro-cracks, and any other subsurface damage or characteristics that would limit fracture strength.

The traditional processes for preparation of the semiconductor tiles employ diamond cutting/trimming a round wafer into a rectangular tile, then edge grinding, and polishing of tile edges. These processes are considered to be relatively costly because of the number of separate process steps involved, including significant cleaning steps to ensure contamination is minimized.

Accordingly, there is a need in the art for new methods and apparatus for handling and processing sheet material (such as SOI structures).

SUMMARY

In an alternative approach to cutting a circular semiconductor wafer into a rectangular tile, rounding the corners and chamfering the edges with diamond cutting and polishing wheels for preparation of a semiconductor, a water jet laser may be employed for cutting and chamfering the wafer. In this new technology, both cutting and chamfering processes may be carried out on a single machine, eliminating additional and costly cleaning steps.

One approach may include employing a conventional vacuum chuck to hold the semiconductor wafer during the cutting, rounding and chamfering processes. The first step may include cutting a round semiconductor wafer into a rectangular tile using the water jet laser with a bottom side of the semiconductor wafer held in the vacuum chuck. The second step may include chamfering the four top edges of the rectangular tile, again with the bottom side of the semiconductor tile held in the vacuum chuck. Next, the semiconductor tile is flipped over such that a top side of the semiconductor tile is held in the vacuum chuck and the four bottom edges are chamfered using the water jet laser. Semiconductor tiles produced in the aforementioned way may meet the dimension and alignment requirements and may be free of subsurface cracks. It is possible, however, that in some applications, the physical contact between the semiconductor wafer/tile surfaces and the vacuum chuck may contaminate the top and bottom surfaces of the resulting semiconductor tile, such as by introducing excessive foreign particles. Experiments have shown that it may be difficult to remove such particles, even via separate cleaning steps. Remnant contamination on the surfaces of the semiconductor tile should be avoided as such may lead to tile breakage and semiconductor-glass bonding failure.

A class of material handling devices, known as Bernoulli wands, has been employed for transporting semiconductor wafers. Bernoulli wands (e.g., formed of quartz) are useful for transporting semiconductors wafers between high temperature chambers. The advantage provided by the Bernoulli wand is that the hot semiconductor wafer generally does not contact the pickup wand, except perhaps at one or more small locators positioned outside the wafer edge on the underside of the wand, thereby minimizing contact damage to the wafer caused by the wand.

When positioned above a semiconductor wafer, the Bernoulli wand uses jets of gas to create a gas flow pattern above the semiconductor wafer that causes the pressure immediately above the semiconductor wafer to be less than the pressure immediately below the semiconductor wafer. Consequently, the pressure imbalance causes the semiconductor wafer to experience an upward "lift" force. Moreover, as the semiconductor wafer is drawn upward toward the wand, the same jets that produce the lift force produce an increasingly larger repulsive force that prevents the semiconductor wafer from contacting the Bernoulli wand. As a result, it is possible to suspend the semiconductor wafer below (or above) the wand in a substantially non-contacting manner.

Although the use of the Bernoulli wand has been helpful in transporting relatively small sized semiconductor wafers (e.g., in the 200-300 mm diameter range), the conventional usages of same are not suited to handling and transport of larger structures. Indeed, as the area of a material sheet increases, the use of conventional Bernoulli wand technology may result in excessive warping, sagging, etc. In addition, conventional Bernoulli wand technology may not be suited for use with a water jet laser system as the excess water may disturb the gas flow patterns that hold the material sheet. Further, conventional Bernoulli wand technology does not provide any significant lateral restraint on the material sheet. Various aspects of the present invention however address these and other issues in connection with cutting and chamfering a circular semiconductor wafer for preparation of a semiconductor tile.

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOI abbreviation is used to refer to semiconductor-on-glass structures in general, including, but not limited to, silicon-on-glass structures (SiOG). The abbreviation SOI encompasses SiOG structures.

In accordance with one or more embodiments of the present invention, an apparatus includes: a base; at least one aero-mechanical device depending from, or otherwise coupled to, or connected to, the base and operating to impart a gas flow to a material sheet, such that the material sheet is suspended, in response to a controlled supply of gas; at least one retaining clamp depending from the base and operating to prevent lateral movement of the material sheet in at least one direction when suspended; and a water jet source operating to provide a stream, from a side of the material sheet opposite the at least one aero-mechanical device, to cut and/or chamfer the material sheet when suspended.

The at least one aero-mechanical device may include at least one of Bernoulli chucks, air bearings, etc. A controller operates to program the controlled supply of gas to the plurality of Bernoulli chucks (and/or air bearings).

In accordance with a preferred cutting procedure, a cutting process is divided into two basic phases: (i) using the water jet laser to cut away respective left and right portions of the material sheet (e.g., a semiconductor wafer), and (ii) holding the resulting left and right edges of the wafer/tile and using the water jet laser to cut away respective remaining portions of the semiconductor war, thereby resulting in a rectangular tile.

In accordance with a preferred chamfering procedure, a chamfering process is also divided into two basic phases: (i) holding the top and bottom edges of the semiconductor tile and using the water jet laser to chamfer respective left and right edges of the semiconductor tile, and (ii) holding the left and right edges of the semiconductor tile and using the water jet laser to chamfer respective top and bottom edges of the semiconductor tile. The semiconductor tile is then flipped over and the chamfering process is repeated to process all eight edges.

Other aspects, features, advantages, etc. will become apparent to one ordinarily skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIGS. 4-5 are perspective views of the apparatus during the process of cutting a circular semiconductor wafer to prepare a rectangular semiconductor tile;

FIGS. 6-7 are perspective views of the apparatus during the process of chamfering respective edges of the semiconductor tile;

DETAILED DESCRIPTION

Figure 1:
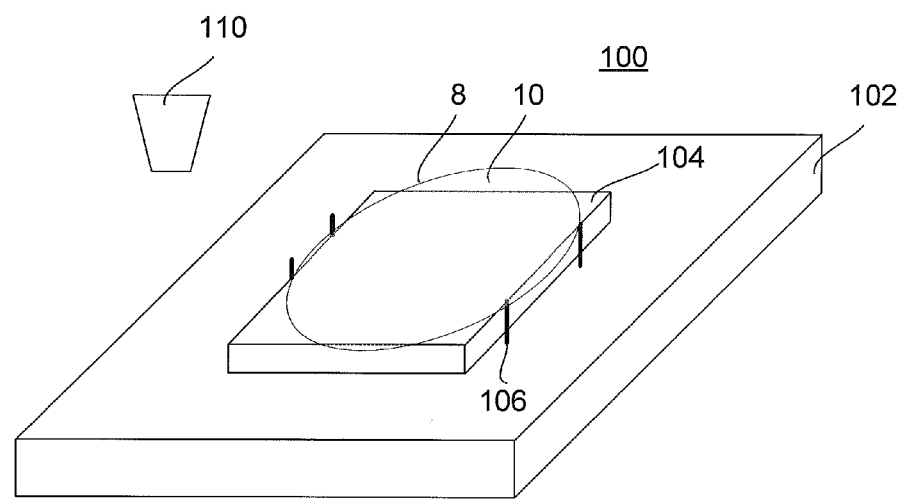
FIG. 1 is a perspective schematic view of an apparatus suitable for cutting and chamfering a circular semiconductor wafer for preparation of a semiconductor tile in accordance with one or more embodiments of the present invention.

With reference to the drawings, wherein like numerals indicate like elements, there is shown in FIG. 1 an apparatus 100 for cutting and chamfering a non-rectangular (e.g., circular) material sheet, such as a semiconductor wafer 10 for preparation of a semiconductor tile. The apparatus 100 includes a base 102 and at least one aero-mechanical device 104 depending from the base 102 and operating to impart a gas flow to the semiconductor wafer 10, such that the semiconductor wafer 10 is suspended, in response to a controlled supply of gas. One or more retaining clamps 106 depend from the base 102 (or other intermediate structure) and operate to prevent lateral movement of the semiconductor wafer 10 in at least one direction when suspended. A water jet source 110 operates to provide a stream, from a side of the semiconductor wafer 10 opposite to the aero-mechanical device 104, to cut and/or chamfer the semiconductor wafer 10 when suspended.

Figure 2:
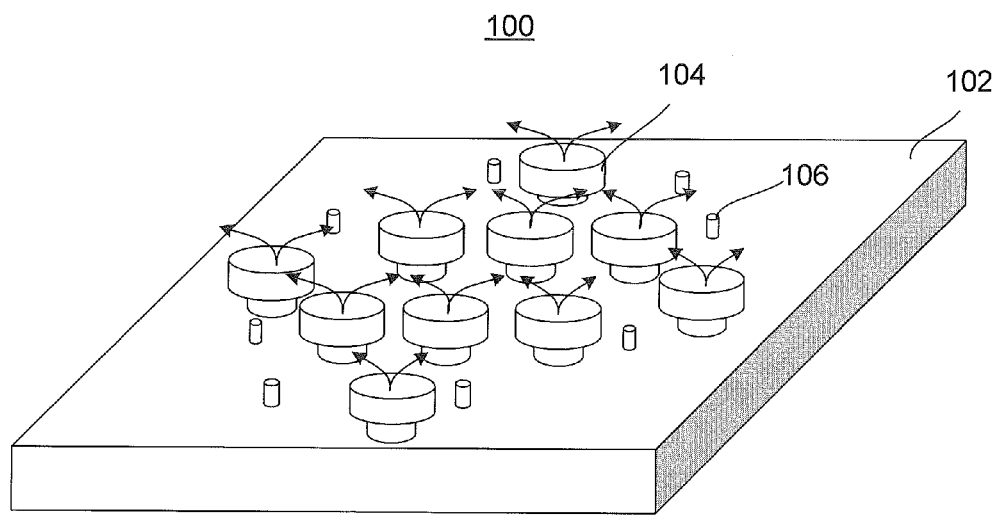
FIG. 2 is a perspective schematic view of an apparatus in which a mechanism for holding the semiconductor wafer/tile includes an array of air bearings or Bernoulli chucks and a system for preventing lateral movement of the semiconductor wafer/tile.
Figure 3A:
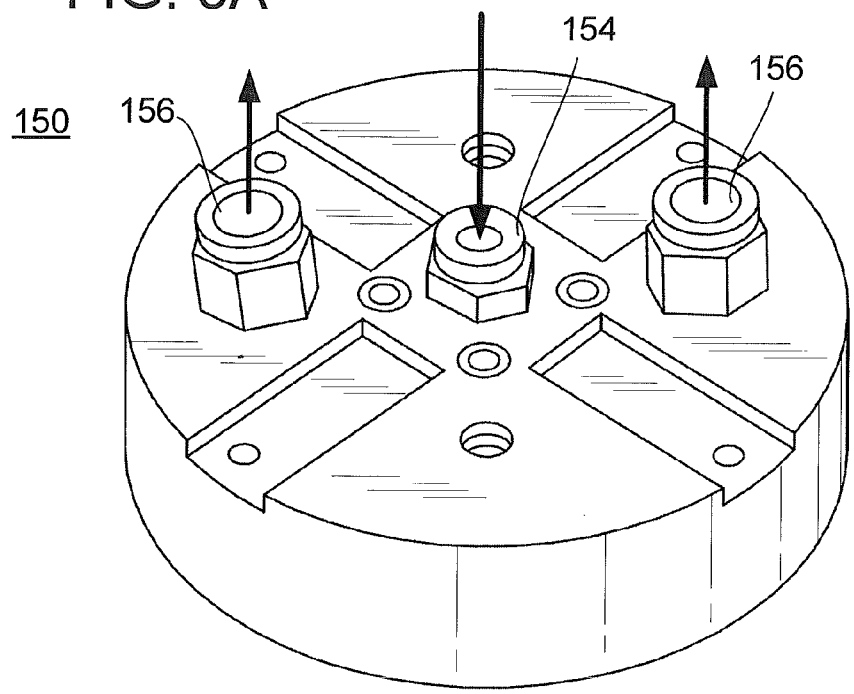
FIGS. 3A and 3B illustrate a rear view and a front view, respectively, of a Bernoulli chuck suitable for use in connection with one or more embodiments of the present invention.
Figure 3B:
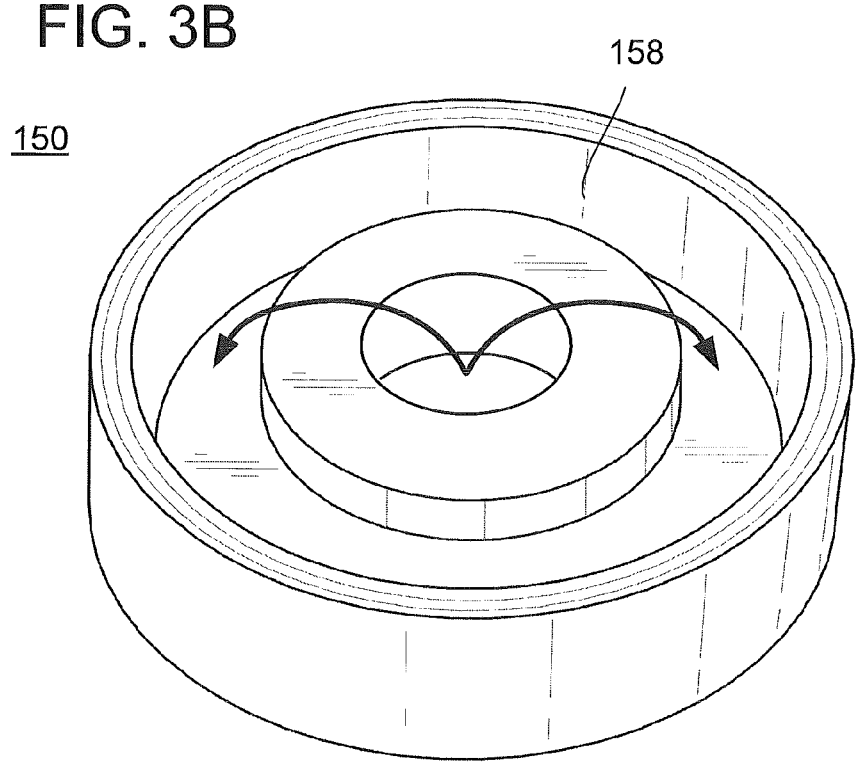

As illustrated in FIG. 2, in one or more embodiments, the at least one aero-mechanical device 104 includes one or more air bearings, which are operable to provide a cushion of air (or other gas) under the semiconductor wafer 10 in order to suspended same within the apparatus 100 (as indicated by the arrows in FIGS. 2, 3B and 4). Such air bearings may be obtained commercially, for example from New Way Air Bearings, Aston, Pa., USA. In one or more alternative embodiments, the at least one aero-mechanical device 104 includes at least one Bernoulli chuck, and preferably a plurality Of Bernoulli chucks. Suitable Bernoulli chucks for implementing a practical device may be obtained commercially from Solar Research Laboratory, Toyonaka-city, Osaka, Japan.

With reference to FIGS. 3A and 3B, top and bottom views of a suitable Bernoulli chuck 150 are illustrated in perspective. Each Bernoulli chuck 150 is operable to create a repelling and/or attracting force to the semiconductor wafer 10, depending on its relative normal position, in response to a controlled supply of gas thereto. In the case of holding a relatively small semiconductor wafer 10, relatively few Bernoulli chucks 150 are needed. For relatively larger semiconductor wafers 10, a larger number of Bernoulli chucks 150 are needed to ensure that warping, sagging, and/or breakage is avoided. Each Bernoulli chuck 150 includes one or more gas inlets 154, optionally one or more gas outlets (exhaust) 156, and optionally one or more annular gas flow apertures 158. When positioned below the semiconductor wafer 10, the Bernoulli chuck 150 establishes a stream of gas to create a gas flow pattern below the semiconductor wafer 10 that causes the pressure immediately below the semiconductor wafer 10 to be higher than the pressure immediately above semiconductor wafer 10. The pressure imbalance causes the semiconductor wafer 10 to experience an upward "lift" force. The one or more Bernoulli chucks 150 are operable to permit the semiconductor wafer 10 to be oriented horizontally, vertically, and/or orientations therebetween. In the illustrated embodiments, the semiconductor wafer 10 is in a generally horizontal orientation. The structure and control of the Bernoulli chucks 150 may be established such that any desired or required holding distance and holding force within the operating range of chuck can be achieved.

With reference to FIGS. 4-5, the apparatus 100, may be used to hold the semiconductor wafer 10 and cut the edges thereof to produce a rectangular tile. In this regard, the aero-mechanical device 104 (whether of Bernoulli chucks, air bearings, or other mechanisms) is activated to create a gas flow that is suitable for suspending and/or holding the semiconductor wafer 10 in a non-contact fashion. In this example, the number of Bernoulli chucks or air bearings are arranged such that about six such devices support an inside portion of the semiconductor wafer 10 (which will become the tile) and about another four devices are deployed around a peripheral edge of the semiconductor wafer 10 to support a scrap part of the wafer 10 which will be cut away during the cutting process.

In accordance with a preferred cutting procedure, the cutting process is divided into two basic phases: (i) using the water jet laser 110 to cut away respective left and right portions of the semiconductor wafer 10, and (ii) holding the resulting left and right edges of the wafer/tile 10 and using the water jet laser 110 to cut away respective remaining portions of the semiconductor wafer 10, thereby resulting in a rectangular tile.

In the first phase, the retaining clamps 106 (in this case four such clamps 106-1, 106-2, 106-3, 106-4) engage the peripheral edges 8 of the semiconductor wafer 10 to prevent lateral movement thereof in at least one first direction (e.g., along a Y axis as labeled) when suspended. Notably, the retaining clamps 106 do not engage either of two spaced apart major surfaces of the semiconductor wafer 10. While the illustrated clamps 106 are in the shape of respective pins, pairs of linear contact blocks may be employed, or other mechanical configurations. As will be discussed later herein, the retaining clamps 106 may be actuated by mechanical, pneumatic, or other automated drives to achieve the desired position about the semiconductor wafer 10. In addition, the clamping force is controlled to a required magnitude such as not to cause any deformation of or damage to the edge of the wafer 10 and/or the later resulting tile.

The water jet source 110 produces a beam 112 (stream of water), from a side of the semiconductor wafer 10 opposite to the aero-mechanical device 104, to cut the semiconductor wafer 10 along the illustrated dotted lines in the Y direction. Notably, the retaining clamps 106 engage the peripheral edges 8 of the semiconductor wafer 10 and prevent lateral movement that would otherwise result from the impact of the beam 112 or other forces that would destroy the tight tolerances desired during the cutting process. During the cutting step, it may be advantageous to employ grippers (not shown) to prevent the scrap portion from colliding with and damaging the edge of the wafer/tile 10.

In the second phase of the cutting process, a further set of retaining clamps 106 (in this case four such clamps 106-5, 106-6, 106-7, 106-8) engage newly formed straight edges 12, 14 of the semiconductor wafer 10 and the retaining clamps 106-1, 106-2, 106-3, 106-4 may be retracted (e.g., into the base 102). The clamps 106-5, 106-6, 106-7, 106-8) prevent lateral movement of the semiconductor wafer 10 in at least one second direction (e.g., along an X axis as labeled, transverse to the Y axis). Again, the retaining clamps 106 do not engage either of two spaced apart major surfaces of the semiconductor wafer 10. The water jet source 110 produces the beam 112 to cut the semiconductor wafer 10 along the illustrated dotted lines in the X direction, resulting in a rectangular semiconductor. clamps 106-5, 106-6, 106-7, 106-8) engage newly formed straight edges 12, 14 of the semiconductor wafer 10 and the retaining clamps 106-1, 106-2, 106-3, 106-4 may be retracted (e.g., into the base 102). The clamps 106-5, 106-6, 106-7, 106-8) prevent lateral movement of the semiconductor wafer 10 in at least one second direction (e.g., along an X axis as labeled, transverse to the Y axis). Again, the retaining clamps 106 do not engage either of two spaced apart major surfaces of the semiconductor wafer 10. The water jet source 110 produces the beam 112 to dice the semiconductor wafer 10 along the illustrated dotted lines in the X direction, resulting in a rectangular semiconductor With reference to FIGS. 6-7, in accordance with a preferred chamfering procedure, the chamfering process is also divided into two basic phases: (i) holding the top and bottom edges 16, 18 of the semiconductor tile 10A and using the water jet laser 110 to chamfer respective left and right edges 12, 14 of the semiconductor tile 10A, and (ii) holding the left and right edges 12, 14 of the semiconductor tile 10A and using the water jet laser 110 to chamfer respective top and bottom edges 16, 18 of the semiconductor tile 10A.

In the first phase of the chamfering process, the retaining clamps 106-1, 106-2, 106-3, 106-4 engage the straight edges 16, 18 of the semiconductor tile 10A, and prevent lateral movement of the semiconductor tile 10A in the first direction (e.g., along a Y axis) and in the second direction (e.g., along an X axis). The retaining clamps may simultaneously prevent movement of the semiconductor tile 10A in a direction normal to the plane of the tile (e.g., along a Z axis). Again, the retaining clamps 106 do not engage either of two spaced apart major surfaces of the semiconductor tile 10A. The water jet source 110 produces the beam 112 to chamfer the left and right edges 12, 14 of the semiconductor tile 10A.

In the second phase of the chamfering process, the second set of clamps 106-5, 106-6, 106-7, 106-8 engage the straight edges 12, 14 of the semiconductor tile 10A and prevent lateral movement of the semiconductor tile 10A in the second direction (e.g., along an X axis) and in the first direction (e.g., along a Y axis), then the retaining clamps 106-1, 106-2, 106-3, 106-4 are retracted. The water jet source 110 then produces the beam 112 to chamfer the top and bottom edges 16, 18 of the semiconductor tile 10A.

The semiconductor tile 10A may then be flipped over and the two phase chamfering process described above may be repeated to chamfer the other edges.

Figure 8:
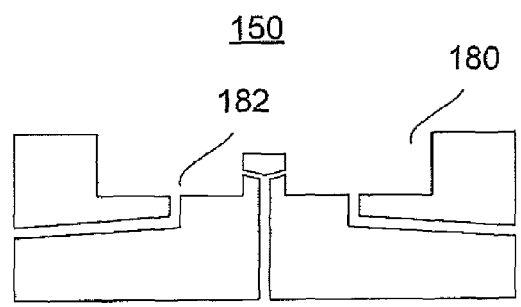
FIG. 8 is a cross-sectional view through a Bernoulli chuck employing an alternative fluid drainage feature.

With reference to FIG. 8, the use of the water jet laser source 110 presents special challenges in connection with managing run-off of the water that may accumulate in parts of the apparatus 100. For example, when one or more Bernoulli chucks 150 are employed to implement the aero-mechanical device 104, water may accumulate in an upwardly directed cup 180 thereof. In this regard, the Bernoulli chuck 150 may include one or more drainage ports 182 that operate to permit the run-off water to exit the cup 180 of the chuck 150. Note these ports must be closed during operation of the Bernoulli chuck so as to not disturb the airflow pattern required for desired operation.

In an alternative arrangement, when the aero-mechanical device 104 includes a plurality of Bernoulli chucks 150, the chucks 150 may repel and/or attract the semiconductor wafer 10. This permits non-horizontal (transverse) orientations of the semiconductor wafer 10 during cutting and/or chamfering. One such orientation is a completely vertical orientation, where the water jet source 110 operates to impart the stream substantially horizontally to the semiconductor wafer 10. This configuration (as well as other transverse configurations) would permit the run-off water to naturally drain from the apparatus 100 by way of gravity.

Figure 9:
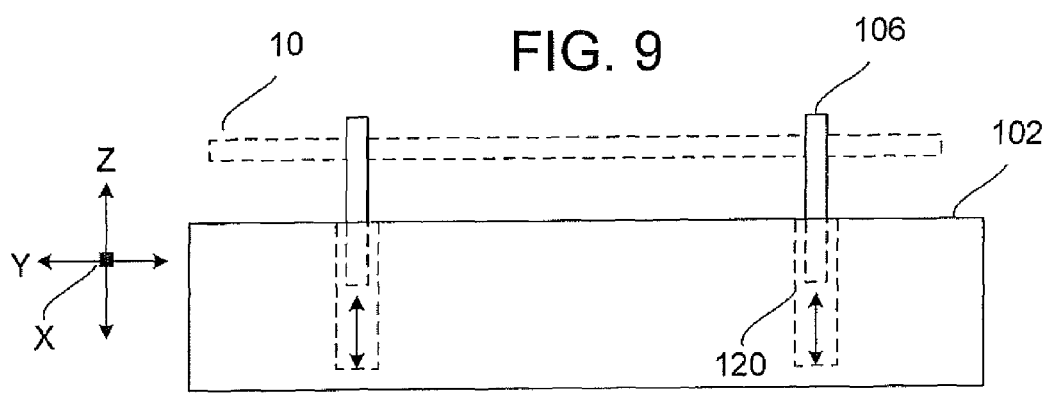
FIG. 9 is a side schematic view of a mechanism for deploying, retracting and translating lateral retention elements that prevent lateral movement of the semiconductor wafer/tile.

With reference to FIG. 9, and as discussed above, the retaining clamps 106 may be actuated by mechanical, pneumatic, or other automated drives 120 to achieve the desired position about the semiconductor wafer 10. The drive 120 is preferably located within the base 102 and includes a void, which the clamp may be retracted (partially or entirely) into, and deployed from, in the Z direction as indicated by the arrow. In addition, the drive 120 operates to permit the retaining clamp 106 to be laterally adjustable such that various sizes of semiconductor wafers 10 and the changing lateral dimensions thereof due to cutting, etc. may be accommodated. In addition, the clamping force is controlled to a required magnitude such as not to cause any deformation of the wafer 10 and/or the later resulting tile. The clamping force is also controlled such as not to cause any damage to the edge of the wafer 10 and/or the resulting tile. Those skilled in the art will appreciate the various specific ways that such drives may be implemented using mechanical, pneumatic, and/or other manual/automated mechanisms.

Figure 10:
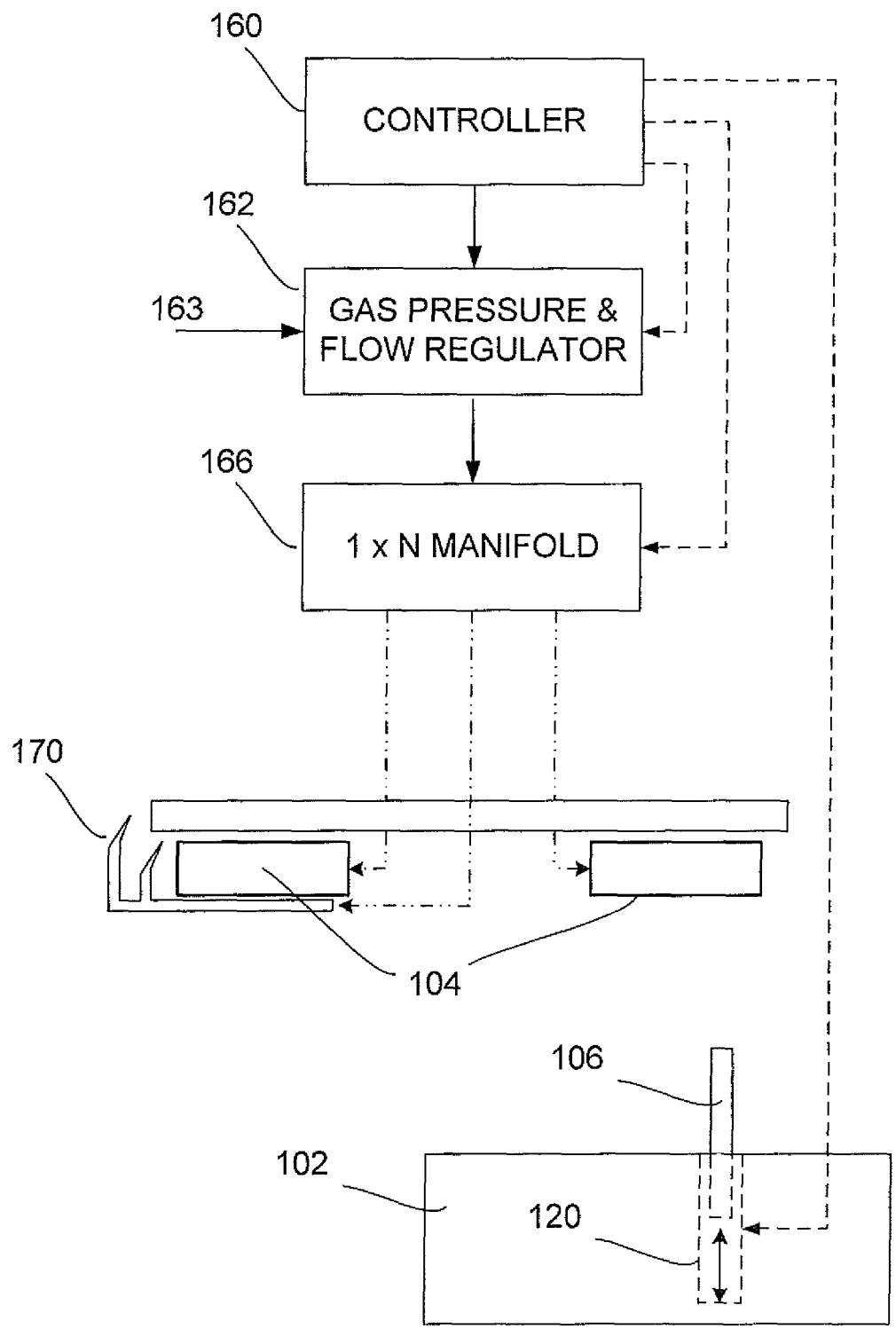
FIG. 10 is a block diagram of a control system suitable for implementing one or more embodiments of the present invention.

With reference to FIG. 10, the apparatus 100 may further include one or more of: a controller 160, a gas pressure and flow regulator 162 for receiving and regulating a flow of gas 163 from source of gas (not shown), and a 1×N manifold 166. The controller 160 is operable to program one or more elements of the apparatus 100. The controller 160 may be implemented using suitable microprocessor systems, or using any of the known, or hereinafter developed, technology. For example, the controller 160 may be coupled to the gas pressure and flow regulator 162. The gas pressure and flow regulator 162 is operable to respond to electrical commands from the controller 160 by providing a controlled supply of gas to the aero-mechanical device 104 (such as the one or more Bernoulli chucks 150, air bearings, etc.). The gas pressure and flow regulator 162 may be implemented using any of the known, or hereinafter developed, technologies. The 1×N manifold 166 may be employed to direct the source of gas to the aero-mechanical device 104. Thus, in one example, when working with a semiconductor wafer 10 of significant size, a number (N) of Bernoulli chuck(s) 150 and/or air bearings may be required. Then the 1×N manifold 166 would provide gas to each of the N Bernoulli chucks, etc. Preferably, more than one 1×N manifold 166 would provide gas to groups of Bernoulli chucks, etc. The controller 160 may also be operable to provide control signals to the drives 120 in order to achieve the aforementioned retraction, deployment and translational functionality.

An alternative or additional feature may be employed by the apparatus 100, for example, at least one gas jet 170 located proximate to a junction of the semiconductor wafer 10 and the aero-mechanical device 104. The one or more gas jets 170 are operable to impart a stream of gas to the semiconductor wafer 10 to promote removal or disengagement thereof from the aero-mechanical device 104. This has particular use when the aero-mechanical device 104 is implemented by way of one or more Bernoulli chucks 150, in order to break the attractive force imparted by the chucks 150 on the semiconductor wafer 10. In such an embodiment, the 1×N manifold 166 may be employed to direct the source of gas to the one or more Bernoulli chuck(s) 150 and to the one or more gas jets 170. The provision of gas to the one or more gas jets 170 may also be facilitated by way of the controller 160 programming the 1×N manifold 166. In this arrangement, the 1×N manifold can separately control the gas flow to each of its N outputs. This additional feature also facilitates loading a wafer 10 into the apparatus 100 by adding to the suspension force.

In an alternative embodiment, the function of the at least one gas jet 170 may be accomplished using a low-speed gas flow emanating from a porous medium and/or a repelling magnetic field.

Figure 11:
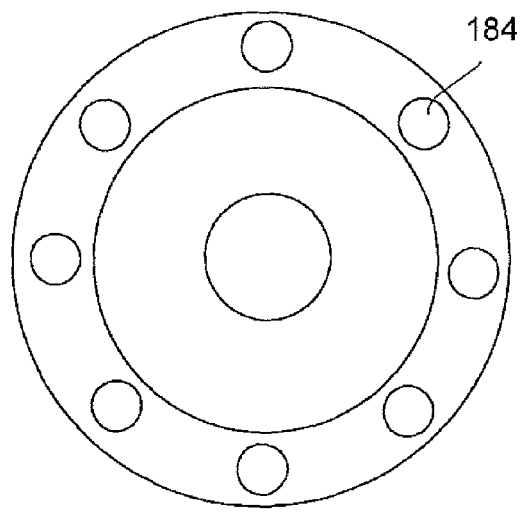
FIG. 11 is a top view of an alternative disengagement feature that may be integrated with the Bernoulli chuck of FIGS. 3A, 3B.

With reference to FIG. 11, one or more of the Bernoulli chucks 150 may be provided with air blowing holes 184 arranged around a periphery thereof. The air blowing holes 184 are operable to provide air flow before the Bernoulli chuck 150 is deactivated, such that the risk of physical contact between the semiconductor wafer 10 and the chuck 150 is avoided during the release of the wafer 10 or the tile 10A. Air provided in this manner also reduces the risk of physical contact between the semiconductor wafer 10 or the tile 10A during loading of the semiconductor wafer 10 or the tile 10A into apparatus 100.

Advantages of one or more aspects of the invention include: (i) that the apparatus 100 can eliminate the physical contact between the surface of the semiconductor wafers 10 or tiles 10A and the holding mechanism, such as a Bernoulli chuck, and avoid contact-related damage, contamination, and particles; (ii) that the method of water jet laser cutting and chamfering rectangular silicon tiles produce, e.g., silicon tiles, which not only meet dimension, form, alignment requirements, but also satisfy tile cleanliness requirements; and (iii) that the non-contact holding apparatus and the method of tile production enable double-sided chamfering with attendant double-sided cleanliness. Thus, various aspects of the invention may reduce and possibly eliminate the need for cleaning after tile cutting and chamfering.

Figure 12:
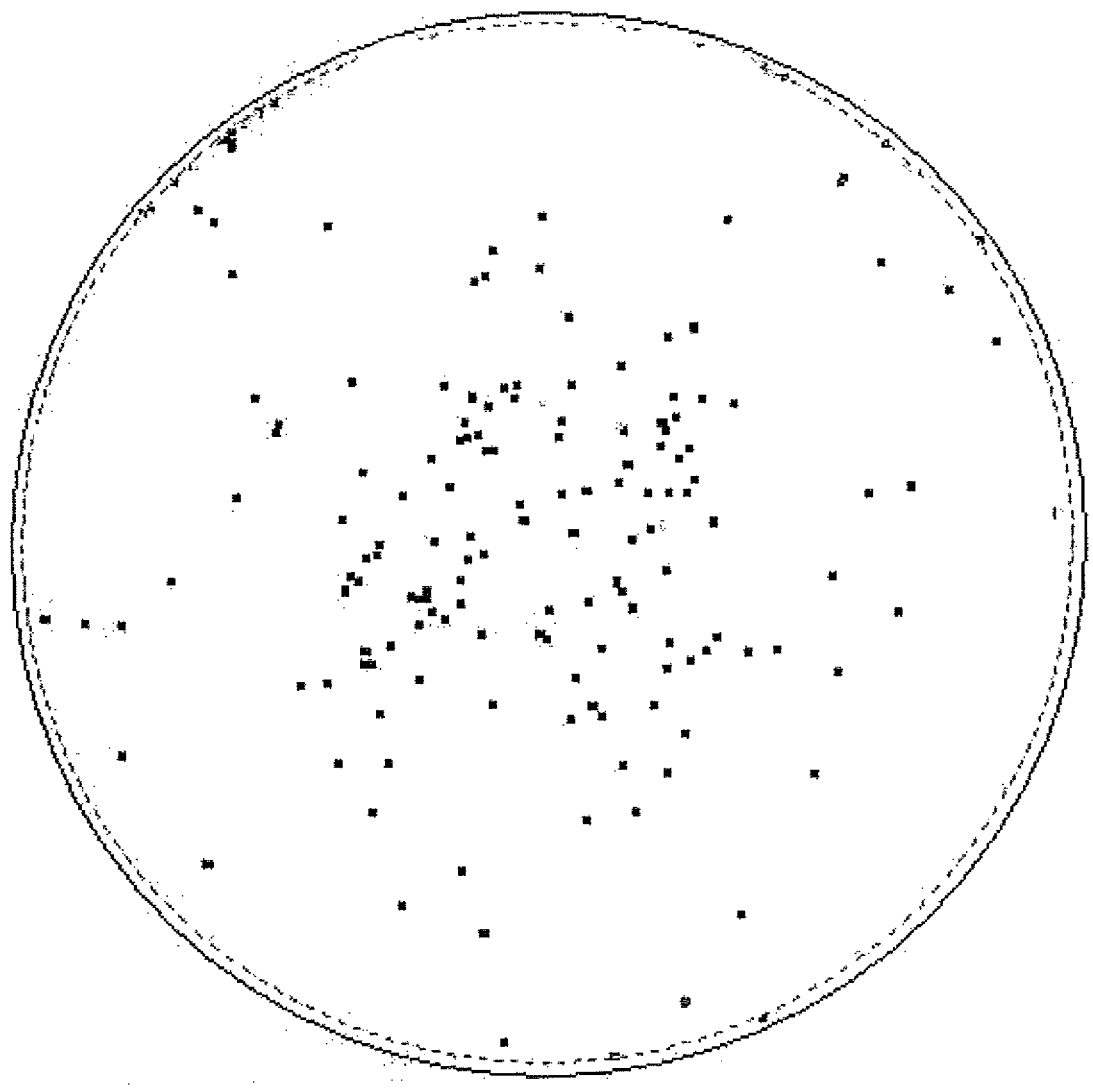
FIG. 12 is a graph illustrating test results as to a level of contamination on a surface of a semiconductor wafer resulting from a process of holding the semiconductor wafer in an apparatus of the present invention.

With reference to FIG. 12, experimentation was carried out in accordance with one or more aspects of the present invention. A prototype apparatus employing a non-contact air bearing chuck was constructed in accordance with clean-room requirements. The chuck itself included a porous plastic (Porex™ X-5085) disk located in a housing made of Water-clear™ resin by stereolithography. The chuck body was formed using a round 58 mm diameter air bearing to support a 100 mm silicon wafer. The prototype included four stop pillars to prevent lateral movement of the wafer during test. Elevation tests were conducted with using a highly filtered nitrogen source at flow rates of about 1.4 cfm at less than 2 psi, such that a clean gap was visible between the wafer and the chuck. Candela CS-10 (KLA-Tencor, California, USA) was used to compare the cleanliness of the wafer before and after respective five minute elevation cycles. An SSEC ML3400 (Solid State Equipment Corporation, PA, USA) was used to clean the wafer with a mild recipe (only ozone and dilute SC1). The Candela CS-10 was used again to inspect for cleanliness after the SSEC cleaning cycle.

In one test cycle (not shown in FIG. 12) an arc of dots (which indicated contamination) in the upper left quadrant of the scan was visible after an elevation cycle but before cleaning. The circular shape of the arc appeared to be of similar diameter to the chuck. While the operator attempted to place the wafer onto the chuck without touching, there may have been slight contact between the chuck and wafer during unloading. Thus, this one test cycle was believed to be an anomaly. The result of the test cycle illustrated in FIG. 12 was indicative of numerous other test cycles and is believed to represent the capabilities of the apparatus 100. The result clearly shows that the non-contact chuck produces a relatively low level of chuck-induced contamination. A comparison of the wafer particle counts before and after interaction with the chuck shows that few particles were added to the wafers as a result of elevation using the chuck. In addition, after a rather mild cleaning, the particle map of the wafers appeared to be very similar to those of the original states of the wafers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for processing a material sheet, comprising:
   a base;
   at least one non-contact aero-mechanical device in the base that, when the material sheet is selectively located on the base over the aero-mechanical device, emits a controlled gas flow that imparts a repelling force to the material sheet and suspends the material sheet above the base, whereby the material sheet is spaced from and prevented from contacting the base and the at least one aero-mechanical device during cutting or chamfering of the material sheet;
   at least one set of a plurality of first retaining camps depending from the base in an array surrounding the material sheet that are laterally adjustable to selectively press against opposing peripheral edges of the material sheet selectively located on the base over the aero-mechanical device with a controlled clamping force and prevent movement of the material sheet in at least one direction when suspended and during cutting or chamfering of the material sheet; and
   a water jet source that provides a stream, from a side of the material sheet opposite the at least one aero-mechanical device, to cut or chamfer the material sheet when suspended.

2. The apparatus of claim 1, wherein the plurality of first retaining clamps does not engage either of two spaced apart major surfaces of the material sheet selectively located on the base over the aero-mechanical device.

3. The apparatus of claim 1, wherein the plurality of first retaining clamps are retractable partly or fully into the base when not in use and deployable out of the base to engage edge portions of the material sheet selectively located on the base over the aero-mechanical device.

4. The apparatus of claim 1, wherein the plurality of first retaining clamps is laterally adjustable such that various sizes of material sheets may be accommodated.

5. The apparatus of claim 1, wherein the at least one aero-mechanical device includes at least one of: Bernoulli chucks and air bearings.

6. The apparatus of claim 1, wherein:
   the at least one aero-mechanical device includes one or more Bernoulli chucks operating to, when the material sheet is selectively located on the base over the aero-mechanical device, horizontally impart repelling and attracting forces to the material sheet in response to the controlled supply of gas and hold the material sheet in a vertical orientation; and
   the water jet source operates to impart the stream substantially horizontally to the material sheet.

7. The apparatus of claim 1, wherein:
   the at least one aero-mechanical device includes a plurality of Bernoulli chucks that impart repelling and attracting forces in a generally vertical direction to the material sheet selectively located on the base over the aero-mechanical device; and
   at least one of the Bernoulli chucks includes at least one drainage port operating to permit run-off water from the water jet, source to exit the chuck.

8. The apparatus of claim 1, wherein:
   the at least one aero-mechanical device includes a plurality of Bernoulli chucks that impart repelling or attracting forces in a generally vertical to the material sheet selectively located on the base over the aero-mechanical device direction; and
   the apparatus further comprises at least one gas jet located proximate to the material sheet and imparting a stream of gas to the material sheet selectively located on the base over the aero-mechanical device to promote separation of the material sheet from the plurality of Bernoulli chucks.

9. The apparatus of claim 8, further comprising a controller operating to program the controlled supplies of gas to the plurality of Bernoulli chucks and to program at least one source of gas to the at least one gas jet.

10. An apparatus for processing a material sheet, comprising:
    a base;
    at least one non-contact aero-mechanical device in the base that, when the material sheet is selectively located on the base over the aero-mechanical device, emits a controlled gas flow that imparts a repelling force to the material sheet and suspends the material sheet about the base, whereby the material sheet is spaced from and prevented from contacting the base and the at least one aero-mechanical device during cutting or chamfering of the material sheet;
    a plurality of first retaining clamps depending from the base in an array surrounding the material sheet that are laterally adjustable to selectively press against a first pair of opposing edge portions of the material sheet selectively located on the base over the aero-mechanical device with a controlled clamping force and prevent movement of the material sheet and hold the material sheet in place during cutting or chamfering of the material sheet;
    a water jet source that provides a stream, from a side of the material sheet opposite the at least one aero-mechanical device, to cut off at least one edge portion, other than the first pair of opposing edge portions, of the material sheet selectively located on the base over the aero-mechanical device and held in place by the plurality of first retaining clamps revealing at lest one newly formed edge portion on the cut material sheet; and
    further comprising a plurality of second retaining clamps depending from the base in an array at least partially within the array of first retaining clamps, the array of second retaining clamps surrounding the cut material sheet selectively located on the base over the aero-mechanical device and are laterally adjustable to press against a second pair of opposing edge portions of the cut material sheet, that includes the at least one newly formed edge portion of the cut material sheet, with a controlled clamping force to prevent movement of the cut material sheet in at least one direction when suspended and during cutting or chamfering of at least a portion of the first pair of opposing edge portions the cut material sheet.

11. The apparatus of claim 10, wherein the plurality of second retaining clamps does not engage either of two spaced apart major surfaces of the material sheet selectively located on the base over the aero-mechanical device.

12. The apparatus of claim 10, wherein the plurality of second retaining clamps is retractable partly or fully into the base when not in use and deployable out of the base to engage edge portions of the material sheet selectively located on the base over the aero-mechanical device.

13. The apparatus of claim 10, wherein the plurality of first retaining clamps is laterally adjustable such that various sizes of material sheets may be accommodated.

14. The apparatus of claim 10, wherein the plurality of first retaining clamps and the plurality of second retaining claims do not engage either of two spaced apart major surfaces of the material sheet selectively located on the base over the aero-mechanical device.

15. The apparatus of claim 10, wherein the plurality of first retaining clamps and the plurality of second retaining claims are retractable partly or fully into the base when not in use and deployable out of the base to engage edge portions of the material sheet selectively located on the base over the aero-mechanical device.

* * * * *